United States Patent
Kankani et al.

(10) Patent No.: US 9,761,290 B1
(45) Date of Patent: Sep. 12, 2017

(54) OVERHEAT PREVENTION FOR ANNEALING NON-VOLATILE MEMORY

(71) Applicant: SanDisk Technologies LLC, Plano, TX (US)

(72) Inventors: Navneeth Kankani, Fremont, CA (US); Ning Ye, San Jose, CA (US); Suresh Upadhyayula, San Jose, CA (US); Sarath Puthenthermadam, San Jose, CA (US); Deepanshu Dutta, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/247,912

(22) Filed: Aug. 25, 2016

(51) Int. Cl.
| | |
|---|---|
| *G11C 5/02* | (2006.01) |
| *G11C 7/20* | (2006.01) |
| *H01L 23/34* | (2006.01) |
| *H01L 23/367* | (2006.01) |
| *H01L 23/373* | (2006.01) |
| *H01L 23/467* | (2006.01) |
| *G11C 7/24* | (2006.01) |

(52) U.S. Cl.
CPC .............. *G11C 7/20* (2013.01); *G11C 5/02* (2013.01); *G11C 7/24* (2013.01); *H01L 23/345* (2013.01); *H01L 23/3675* (2013.01); *H01L 23/3736* (2013.01); *H01L 23/467* (2013.01)

(58) Field of Classification Search
CPC .... G11C 7/20; G11C 5/02; G11C 7/24; H01L 23/345; H01L 23/3675; H01L 23/3736; H01L 23/467

USPC .... 365/51, 52, 53, 54, 57, 59, 60, 106, 139, 365/200, 206, 211, 222

See application file for complete search history.

(56) References Cited

U.S. PATENT DOCUMENTS

| | | | |
|---|---|---|---|
| 6,700,099 B2 | 3/2004 | Cole, Sr. et al. | |
| 7,821,828 B2 | 10/2010 | Song et al. | |
| 8,138,573 B2 | 3/2012 | Cannon et al. | |
| 8,341,335 B2 * | 12/2012 | Weingarten | G06F 12/0246 365/185.33 |
| 8,344,475 B2 | 1/2013 | Shaeffer et al. | |
| 8,488,387 B2 | 7/2013 | Lue et al. | |
| 8,497,544 B2 | 7/2013 | Bronner et al. | |
| 8,516,343 B2 | 8/2013 | Flynn et al. | |
| 8,824,212 B2 | 9/2014 | Lue | |
| 2006/0103007 A1 | 5/2006 | Aitken et al. | |

(Continued)

OTHER PUBLICATIONS

H.-T. Lue et al., "Radically Extending the Cycling Endurance of Flash Memory (to >100M Cycles) by Using Built-In Thermal Annealing to Self-Heal the Stress-Induced Damage" Macronix International, IEDM, Dec. 2013.

*Primary Examiner* — Fernando Hidalgo
(74) *Attorney, Agent, or Firm* — Kunzler Law Group, PC

(57) ABSTRACT

Apparatuses, systems, methods, and computer program products are disclosed for preventing overheating, for annealing non-volatile memory. An apparatus may include an array of non-volatile storage elements. A heating element may be configured to heat a first set of the non-volatile storage elements to anneal the first set of non-volatile storage elements. A heat shield or cooling element may be configured to prevent a second set of the non-volatile storage elements from overheating during annealing of the first set of non-volatile storage elements, to mitigate data errors for data stored on the second set of non-volatile storage elements.

18 Claims, 10 Drawing Sheets

(56) References Cited

U.S. PATENT DOCUMENTS

| | | | |
|---|---|---|---|
| 2009/0201729 A1* | 8/2009 | Song | G11C 7/04 365/185.05 |
| 2010/0025811 A1 | 2/2010 | Bronner et al. | |
| 2013/0148437 A1 | 6/2013 | Bronner et al. | |
| 2013/0238839 A1* | 9/2013 | Weingerten | G06F 12/0246 711/103 |
| 2014/0140156 A1* | 5/2014 | Shoemaker | G11C 7/04 365/201 |
| 2015/0230327 A1* | 8/2015 | Ellis | H05K 1/0203 361/694 |
| 2016/0212512 A9* | 7/2016 | Mazed | H04B 10/272 |
| 2016/0320495 A1* | 11/2016 | Ying | G01T 1/2002 |

\* cited by examiner

OVERHEAT PREVENTION FOR ANNEALING NON-VOLATILE MEMORY

TECHNICAL FIELD

The present disclosure, in various embodiments, relates to non-volatile memory and more particularly relates to preventing overheating while annealing non-volatile memory.

BACKGROUND

Writing and erasing various types of non-volatile memory can cause damage to the storage medium. For example, in flash memory, which stores data by storing charge on a floating gate, writing and erasing may damage the tunnel oxide layer between the substrate and the floating gate, creating sites in the oxide layer that trap charge carriers. Charge storage and leakage via trap sites may cause data errors. Thus, as the density of trap sites increases due to repeated writing and erasing, data error rates may also increase. Cumulative damage caused by repeated writing and erasing may limit the useful lifetime of various types of non-volatile memory.

Annealing certain types of non-volatile memory at higher-than-operating temperatures may reverse damage caused by repeated writing and erasing. For example, thermal annealing of flash memory may provide sufficient energy to restore trap sites to their original state, thereby reducing the number of defects and improving the longevity and endurance of an annealed memory device. However, annealing temperatures may themselves cause charge leakage and data errors, making it impractical to anneal operating non-volatile memory.

SUMMARY

Apparatuses are presented for preventing overheating, for annealing non-volatile memory. In one embodiment, an apparatus includes an array of non-volatile storage elements. In a certain embodiment, a heating element is configured to heat a first set of the non-volatile storage elements to anneal the first set of non-volatile storage elements. In a further embodiment, a heat shield is configured to mitigate heating for a second set of the non-volatile storage elements during annealing of the first set of non-volatile storage elements, to mitigate data errors for data stored on the second set of non-volatile storage elements.

An apparatus, in another embodiment, includes a resistive heating element that produces heat to anneal a first set of non-volatile memory elements. In a certain embodiment, a cooling element cools a second set of non-volatile memory elements, in proximity to the first set of non-volatile memory elements, to prevent the second set of non-volatile memory elements from overheating during annealing of the first set of non-volatile memory elements. In a further embodiment, a controller is configured to activate the heating element and the cooling element to anneal the first set of non-volatile memory elements and to cool the second set of non-volatile memory elements.

Methods are presented of preventing overheating for annealing non-volatile memory. In one embodiment, a method includes annealing a first set of non-volatile storage elements by heating the first set of non-volatile storage elements. In a certain embodiment, the method includes cooling a second set of non-volatile storage elements to reduce a rate of data errors caused by heat from annealing the first set of non-volatile storage elements.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
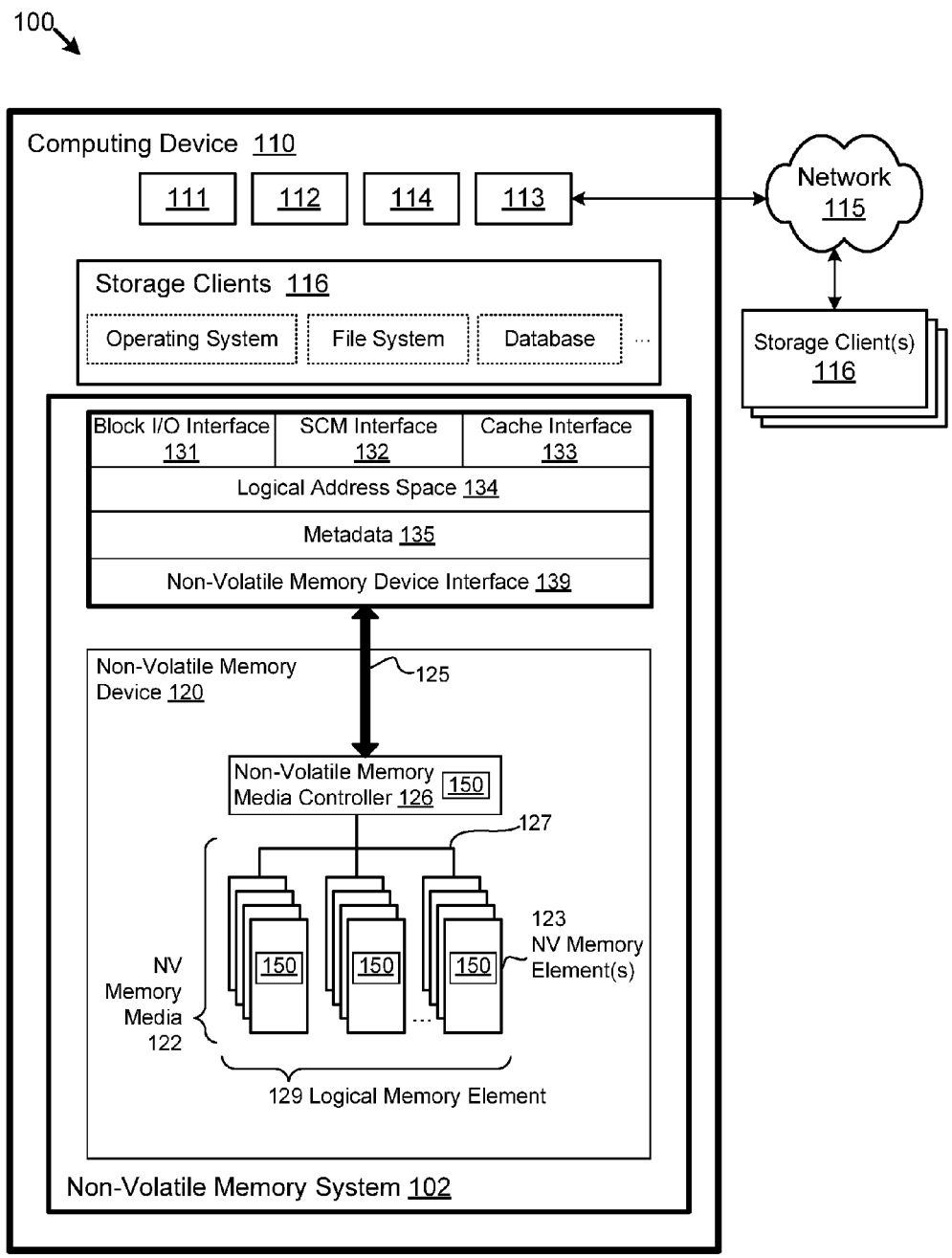
FIG. 1 is a schematic block diagram of one embodiment of a system comprising an anneal component.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of preceding figures. Like numbers may refer to like elements in the figures, including alternate embodiments of like elements.

FIG. 1 is a block diagram of one embodiment of a system 100 comprising an anneal component 150 for a non-volatile memory device 120. The anneal component 150 may be part of and/or in communication with one or more of a non-volatile memory media controller 126, a non-volatile memory element 123, a device driver, or the like. The anneal component 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 124 to a communication network 115, such as an Internet Protocol network, a Storage Area Network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. Alternatively, or in addition, one or more portions of the anneal component 150 may be embodied as one or more computer readable instructions stored on the non-transitory storage media 114.

The non-volatile memory system 102, in the depicted embodiment, includes an anneal component 150. The anneal component 150, in one embodiment, includes a heating element configured to heat a first set of the non-volatile memory elements 123 to anneal the first set of non-volatile memory elements 123. In a further embodiment, the anneal component 150 includes a heat shield configured to mitigate heating for a second set of the non-volatile memory elements 123 during annealing of the first set of non-volatile memory elements 123. In certain embodiments, annealing a first set of non-volatile memory elements 123 may reverse damage caused by repeated writing and erasing, heal defects, restore charge trap sites to an original state, or otherwise improve the longevity or endurance of the annealed non-volatile memory elements 123. However, in some embodiments, annealing temperatures may cause charge leakage and/or data errors. Thus, in further embodiments, mitigating heating for and/or preventing a second set of non-volatile memory elements 123 from overheating during annealing of the first set of non-volatile memory elements 123 may mitigate data errors for data stored on the second set of non-volatile memory elements 123.

In one embodiment the anneal component 150 may comprise logic hardware of one or more non-volatile memory devices 120, such as a non-volatile memory media controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the anneal component 150 may comprise executable software code, such as a device driver or the like, stored on the computer readable storage medium 114 for execution on the processor 111. In a further embodiment, the anneal component 150 may include a combination of both executable software code and logic hardware.

In one embodiment, the anneal component 150 is configured to receive requests relating to annealing from a device driver or other executable application via a bus 125 or the like. The anneal component 150 may be further configured to communicate with a device driver or other application via the bus 125. Accordingly, the anneal component 150, in some embodiments, may comprise and/or be in communication with one or more direct memory access (DMA) modules, remote DMA modules, bus controllers, bridges, buffers, and so on to facilitate communication of information relating to annealing. In another embodiment, the anneal component 150 may receive anneal requests as an API call from a storage client 116, as an IO-CTL command, or the like. The anneal component 150 is described in greater detail below with regard to FIGS. 7 and 8.

According to various embodiments, a non-volatile memory controller 126 comprising an anneal component 150 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the non-volatile memory media controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective non-volatile memory media controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more non-volatile memory media controllers 126.

A device driver may present a logical address space 134 to the storage clients 116 through one or more interfaces. As discussed above, the logical address space 134 may comprise a plurality of logical addresses, each corresponding to respective media locations the on one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 126 is part of and/or in communication with one or more non-volatile memory devices 120. Although FIG. 1 depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise a non-volatile recording media capable of recording data, which may be referred to as a non-volatile memory media, a non-volatile storage media, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, expansion cards, or the like. A non-volatile memory media controller 126 may be configured to manage data operations on the non-volatile memory media 122, and may comprise one or more processors, programmable processors (e.g., FPGAs), ASICs, micro-controllers, or the like. In some embodiments, the non-volatile memory media controller 126 is configured to store data on and/or read data from the non-volatile memory media 122, to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The non-volatile memory controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102.

A device driver may further comprise a non-volatile memory device interface 139 that is configured to transfer data, commands, and/or queries to the non-volatile memory media controller 126 over a bus 125, as described above.

Figure 2:
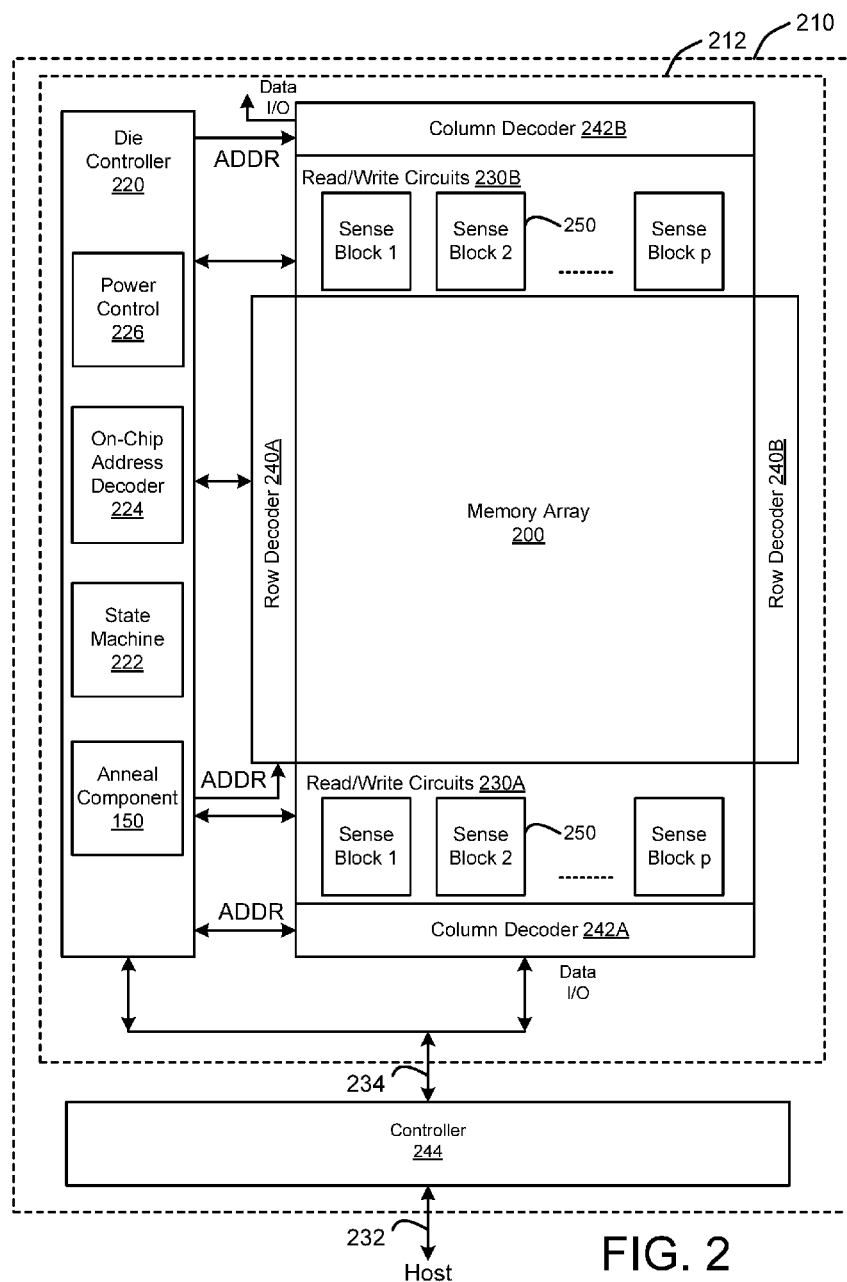
FIG. 2 is a schematic block diagram illustrating one embodiment of a non-volatile storage device comprising an anneal component.

FIG. 2 illustrates an embodiment of a non-volatile storage device 210 that may include one or more memory die or chips 212. The non-volatile storage device 210 may be substantially similar to the non-volatile memory device 120 described with reference to FIG. 1. Memory die 212, in some embodiments, includes an array (two-dimensional or three dimensional) of memory cells 200, die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Die controller 220, in one embodiment, cooperates with the read/write circuits 230A/230B to perform memory operations on the memory array 200. The die controller 220, in certain embodiments, includes an anneal component 150, a state machine 222, an on-chip address decoder 224, and a power control circuit 226. The anneal component 150, in one embodiment, is configured to anneal the memory array 200 by heating the memory array 200. In a further embodiment, the anneal component 150 is configured to cool the memory array 200 to reduce a rate of data errors caused by heat from annealing another memory array 200 (e.g., on another memory die 212). In one embodiment, the anneal component 150 includes one or more heating elements, and one or more heat shields or cooling elements. The anneal component 150, in certain embodiments, may include software of a device driver, and/or hardware in a device controller 244, a die controller 220 and/or state machine 222.

The state machine 222, in one embodiment, provides chip-level control of memory operations. The on-chip address decoder 224 provides an address interface to convert between the address that is used by the host or a memory controller to the hardware address used by the decoders 240A, 240B, 242A, 242B. The power control circuit 226 controls the power and voltages supplied to the word lines and bit lines during memory operations. In one embodiment, power control circuit 226 includes one or more charge pumps that can create voltages larger than the supply voltage.

Figure 3:
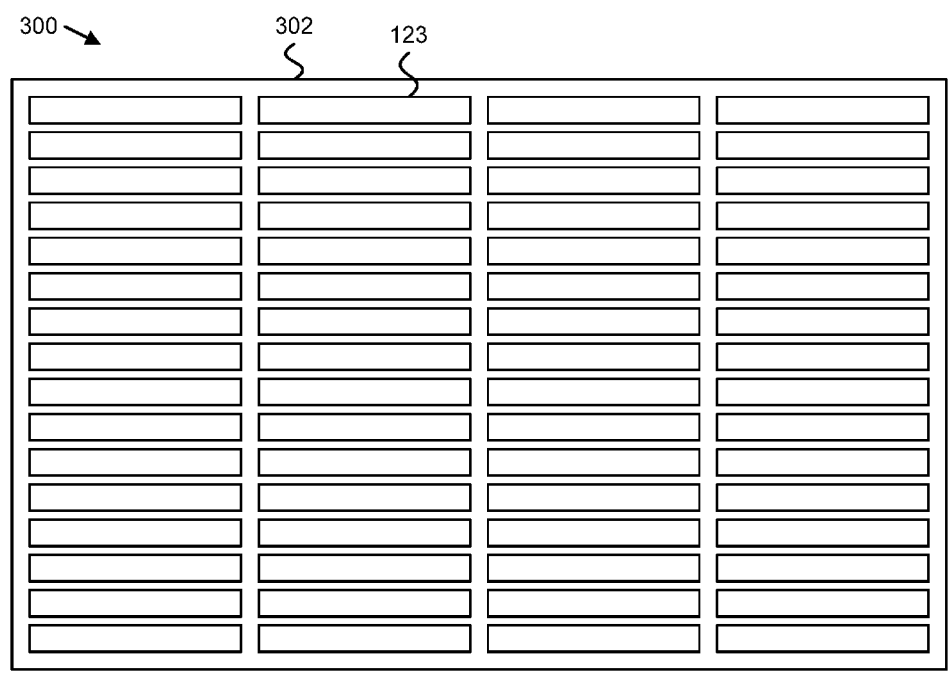
FIG. 3 is a top view illustrating one embodiment of a system comprising an enclosure for multiple non-volatile memory elements.

FIG. 3 depicts a system 300 comprising an enclosure 302 for multiple non-volatile memory elements 123. In various embodiments, the enclosure 302 may include any device that encloses multiple non-volatile memory elements 123. In one embodiment, the enclosure 302 may include a power supply, processor, memory, and the like, and may be a server that includes multiple non-volatile memory elements 123. In another embodiment, the enclosure 302 may be a disk shelf, or the like, that encloses multiple non-volatile memory elements 123 and provides connections between the non-volatile memory elements 123 and one or more external computers or controllers. In a certain embodiment, the enclosure 302 may be a storage appliance. For example, in one embodiment, the enclosure 302 may be a 3U rack mounted appliance.

In various embodiments, the enclosure 302 may include ports or connectors that allow clients 116 to access the non-volatile memory elements 123. For example, in various embodiments, the enclosure may include one or more Fibre Channel connections, serial attached SCSI (SAS) connections, Ethernet connections, or the like. In a certain embodiment, an enclosure 302 may include eight SAS connections, each providing data transfer rates of up to six gigabits per second. For example, a four lane SFF-8088 connector may provide four six gigabit per second connections, and an enclosure 302 may include two or more four lane SFF-8088 connections.

In certain embodiments, the enclosure 302 may include internal connections for a plurality of non-volatile memory elements 123. For example, in one embodiment, the enclosure 302 may include a backplane including SAS connectors, PCIe connectors, or the like, that couple to the non-volatile memory elements 123 to communicate commands, addresses, and/or data.

In one embodiment, the non-volatile memory elements 123 may be substantially similar to the non-volatile memory elements 123 described above with regard to FIG. 1, or to the non-volatile storage device 210, or memory die 212 described above with regard to FIG. 2. In various embodiments, a non-volatile memory element 123 may include a die plane, die, chip, chip package, expansion card, traditional hard disk drive form factor for non-volatile memory, or the like. In certain embodiments, the non-volatile memory elements 123 may be expansion cards, separate solid-state drives, or the like. For example, in one embodiment, the non-volatile memory elements 123 may be PCIe cards. In another embodiment, the non-volatile memory elements 123 may be SAS solid-state drives, SATA solid-state drives, or the like.

In certain embodiments, an array or plurality of non-volatile memory elements 123 may be disposed within and connected to the enclosure 302. For example, in one embodiment, the system 300 may include up to 64 non-volatile memory elements 123, each providing 8 terabytes of non-volatile memory, so that the system 300 includes up to half a petabyte of non-volatile memory. Further configurations including various amounts of memory per non-volatile memory element 123 and/or various numbers of non-volatile memory elements 123 will be clear in view of this disclosure.

In one embodiment, the non-volatile memory elements 123 may be configured as one or more arrays using striping, mirroring and/or parity. For example, the non-volatile memory elements 123 may be configured in a redundant array of independent disks (RAID). In another embodiment, the non-volatile memory elements 123 may be configured as one or more logical volumes that span multiple non-volatile memory elements 123 without redundancy or striping.

In certain embodiments, the non-volatile memory elements 123 (or sets of the non-volatile memory elements 123) may be independently annealed. For example, in one embodiment, the enclosure 302 may include heating elements for annealing each non-volatile-memory element 123, a row of non-volatile memory elements 123, a column of non-volatile memory elements 123, or the like. In another embodiment, each non-volatile memory element 123 may include a separate heating element. Because thermal annealing may cause data loss, data may be moved from a set of non-volatile memory elements 123 that is scheduled for annealing to another set of non-volatile memory elements 123 within the enclosure. However, in some embodiments, the heat from annealing one set of non-volatile memory elements 123 may raise the temperature of a nearby set of non-volatile memory elements 123, which still stores data. Overheating may cause data errors in nearby non-volatile memory elements 123. Thus, in certain embodiments, heat shields or cooling elements may be provided on each non-volatile memory element 123, within the enclosure between sets of non-volatile memory elements 123, or the like, to mitigate heating, disperse heat, prevent overheating, or the like, so that data errors are mitigated or reduced.

Additionally, in some embodiments, the enclosure 302 may include insulation, a heat shield, cooling devices, heat sinks, fans, or the like, that exhaust heat from annealing non-volatile memory elements 123 away from the enclosure, to avoid heat damage for nearby devices. For example, in one embodiment, the enclosure 302 may be a rack-mountable device, and may include cooling fans that direct airflow through the enclosure from front to back (e.g., from a cold aisle to a hot aisle of a data center), and insulation at the top and/or bottom of the enclosure 302 to protect other devices mounted in the same rack as the enclosure 302 from overheating.

Figure 4A:
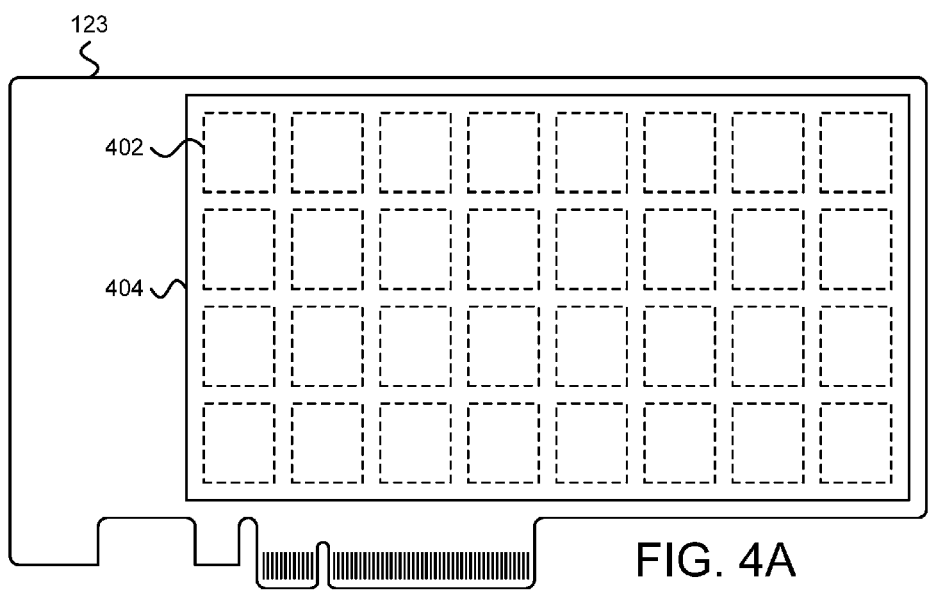
FIG. 4A is a top view illustrating one embodiment of a non-volatile memory element comprising a heat shield.
Figure 4B:
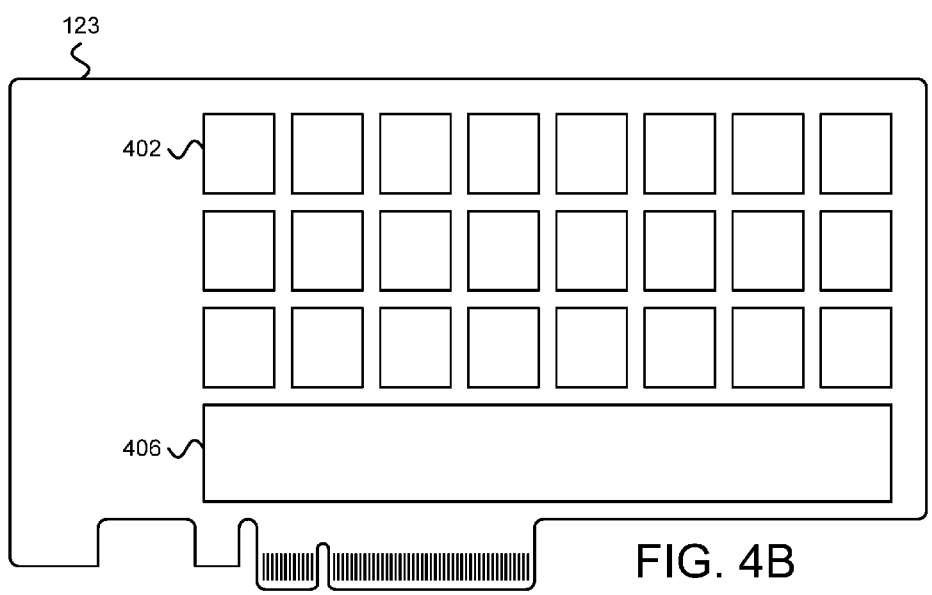
FIG. 4B is a top view illustrating another embodiment of a non-volatile memory element comprising a heat shield.

FIGS. 4A and 4B depict two different embodiments of a non-volatile memory element 123 comprising a heat shield 404, 406. In one embodiment, the non-volatile memory element 123 may be substantially similar to the non-volatile memory elements 123 described above with regard to FIGS. 1 through 3. In the depicted embodiments, the non-volatile memory element 123 is a PCIe card including a plurality of chip packages 402. In another embodiment, the non-volatile memory element 123 may be another type of expansion card, a solid-state drive in a traditional hard drive form factor, a single chip package 402, or a die plane, die, or chip within a chip package 402.

In certain embodiments, a chip package 402 may include one or more chips, which may be substantially similar to the chip 212 described above with regard to FIG. 2, dies, die planes, or the like. Thus, a chip package 402 may include one or more arrays of non-volatile memory cells, such as NAND flash memory cells, ReRAM memory cells, or the like. A non-volatile memory element 123 may include one or more chip packages 402, or one or more dies, die planes, or chips within chip packages 402. In one embodiment, an apparatus for preventing overheating, for annealing non-volatile memory, may include an array of one or more non-volatile memory elements 123. In another embodiment, an apparatus for preventing overheating, for annealing non-volatile memory, may include heating and cooling elements (or heat shields) without non-volatile memory elements 123, and may be installed in conjunction with separately-obtained non-volatile memory elements 123.

In the depicted embodiment, a non-volatile memory element 123 is an expansion card, and an array of non-volatile memory elements 123 may include an array or plurality of expansion cards 123, as described above with regard to the enclosure 302 of FIG. 3. In another embodiment, a non-volatile memory element 123 may be a chip package 402, and an array of non-volatile memory elements 123 may include a row, column, or other set of chip packages 402. Different types of arrays of non-volatile memory elements 123 will be clear in view of this disclosure.

In general, in various embodiments, an array of non-volatile memory elements 123 may include at least two sets of non-volatile memory elements 123. In various embodiments, a "set" of non-volatile memory elements 123 may refer to any group of one or more non-volatile memory elements 123 that may be annealed as a unit (e.g., a set of non-volatile memory elements 123 may be annealed at the same time). In further embodiments, a set of non-volatile memory elements 123 may similarly be cooled, or shielded from the heat of annealing another set of non-volatile memory elements 123 as a unit. For example, in one embodiment, a set of non-volatile memory elements 123 may be thermally coupled to a single heating element, or may be coupled to multiple heating elements that are controlled together. In a certain embodiment, a set of non-volatile memory elements 123 may include one non-volatile memory element 123. In another embodiment, a set of non-volatile memory elements 123 may include a row, column, or other plurality of non-volatile memory elements 123.

In various embodiments, one set of non-volatile memory elements 123 may be heated for annealing while another set of non-volatile memory elements 123 is cooled, or shielded from the heat of annealing the first set. In various embodiments, heating one set of non-volatile memory elements 123 in an array of non-volatile memory elements 123, while cooling or shielding another set of non-volatile memory elements 123 in an array of non-volatile memory elements 123, may provide the endurance and longevity benefits of annealing while mitigating or avoiding data errors so that the array of non-volatile memory elements 123 can continue operating during annealing.

In one embodiment, an apparatus for preventing overheating, for annealing non-volatile memory, may include a heating element that heats a first set of non-volatile memory elements 123 to anneal the first set of non-volatile memory elements 123. For example, in a certain embodiment, a resistive heating element may produce heat to anneal a first set of non-volatile memory elements 123. In various embodiments, "annealing" a set of non-volatile memory elements 123 may refer to any process that raises the set of non-volatile memory elements 123 to temperatures above a normal operating temperature, for the purpose of reversing damage, healing or reducing defects, or otherwise improving the longevity and/or endurance of the annealed set of non-volatile memory elements 123. Heating elements for annealing are described in further detail below with regard to FIGS. 5B-6D.

In one embodiment, an apparatus for preventing overheating, for annealing non-volatile memory, may include a heat shield 404, 406 that mitigates heating, or prevents a second set of the non-volatile memory elements 123 from overheating during annealing of the first set of non-volatile memory elements 123. In various embodiments, mitigating heating may refer to a way of reducing the degree of heating that would otherwise occur in the absence of a heat shield 404, 406. For example, in one embodiment, a heat shield 404, 406 may be a cooling element that cools the second set of non-volatile memory elements. In another embodiment, a heat shield 404, 406 may include a heat sink. Various ways of mitigating heating will be clear in view of this disclosure.

In one embodiment, the set of non-volatile memory elements 123 that is cooled or shielded by the heat shield 404, 406 may include any non-volatile memory elements 123 not being annealed. For example, in a certain embodiment, a first set of non-volatile memory elements 123 in an array of non-volatile memory elements 123 may be annealed, and a second set of non-volatile memory elements 123 that are cooled or shielded by a heat shield 404, 406, may include all the non-annealed non-volatile memory elements 123 in the array. In another embodiment, a second set of non-volatile memory elements 123 that are cooled or shielded by a heat shield 404, 406 may be in proximity to the first, annealed set of non-volatile memory elements 123. In various embodiments, sets of non-volatile memory elements 123 may be in proximity if they are adjacent or otherwise in close thermal connection, so that heating one set particularly affects the other set. By contrast, sets of non-volatile memory elements 123 may not be in proximity if the thermal connection between the sets is distant or attenuated, such that heating one set does not increase errors in another set beyond an acceptable threshold, even in the absence of a heat shield 402, 404. This, in certain embodiments, a set of non-volatile memory elements 123 in proximity to the annealed set of non-volatile memory elements 123 may be shielded or cooled, and one or more further sets of non-volatile memory elements 123, not in proximity to the annealed set of non-volatile memory elements 123, may be neither annealed nor cooled.

In various embodiments, "overheating" may refer to heating beyond a thermal tolerance for a set of non-volatile memory elements 123. For example, in one embodiment, annealing one set of non-volatile memory elements 123 may heat another (e.g., a nearby) set of non-volatile memory elements 123, but whether the other set of non-volatile memory elements 123 is "overheated" may depend on whether a thermal tolerance is exceeded. In one embodiment, a thermal tolerance may be specified by a manufacturer for one or more non-volatile memory elements 123. For example, in one embodiment, a manufacturer may specify a maximum temperature for a non-volatile memory element 123. In certain embodiments, a maximum temperature for a non-volatile memory element 123 may be based on maximum temperature ratings for individual components of the non-volatile memory element 123, such as chip packages, capacitors, solder, or the like. In another embodiment, a thermal tolerance may be determined experimentally based on rates of data errors that occur at various temperatures. In one embodiment, a thermal tolerance may include a maximum temperature. In another embodiment, a thermal tolerance may include one or more maximum durations corresponding to one or more temperatures. For example, if high temperatures cause increasing data errors over time, a thermal tolerance may include a short duration for a high temperature, and a longer duration for a lower temperature. Many types of overheating, and thermal tolerances that indicate whether overheating has occurred, will be clear in view of this disclosure.

In various embodiments "preventing" overheating may refer to any way of avoiding overheating (e.g., avoiding exceeding a thermal tolerance for a set of non-volatile memory elements 123). For example, when a first set of non-volatile memory elements 123 is annealed, preventing overheating for a second set of non-volatile memory elements 123 may include preventing heat from reaching the second set of non-volatile memory elements 123, dissipating heat from the second set of non-volatile memory elements 123, or the like.

In various embodiments, heat may cause data errors, increase a rate of data errors, or the like. For example, in certain embodiments, temperatures sufficient to heal trap sites in the tunnel oxide layer of flash memory may also provide enough thermal energy for charge carriers to escape storage cells (e.g., floating gates), causing changes in stored data values. Other types of non-volatile memory media that store data in other ways may similarly be annealed to reverse damage at temperatures that also affect a physical property that encodes data. In certain embodiments, overheating, even at temperatures below an anneal temperature, may cause undesirable data error rates. Thus, in certain embodiments, during annealing of a first set of non-volatile memory elements 123, preventing overheating for a second set of non-volatile memory elements 123 may mitigate data errors for data stored on the second set of non-volatile memory elements 123. Cooling the second set of non-volatile memory elements 123 may reduce a rate of data errors caused by heat from annealing the first set of non-volatile memory elements 123. In various embodiments, mitigating data errors, or reducing a rate of data errors, may refer to reducing a number of errors that would otherwise occur without a heat shield 404, 406 or cooling element to prevent overheating.

In some embodiments, a heat shield 404, 406 may prevent overheating by maintaining a temperature for a set of non-volatile memory elements 123 at or below normal operating temperatures, so that heat from annealing another set of non-volatile memory elements 123 does not cause any more than a normal rate of data errors. In another embodiment, a heat shield 404, 406 may permit some heating for a set of non-volatile memory elements 123 when another set of non-volatile memory elements 123 is annealed, but may prevent overheating in excess of a thermal tolerance. If some heating is permitted, additional data errors may occur, but the heat shield 404, 406 may mitigate or reduce the number of errors that would occur without the heat shield 404, 406, so that the rate of errors does not exceed a correctable error rate.

In one embodiment, a heat shield 404, 406 may include insulating material. For example, insulating material of a heat shield 404, 406 may be disposed between a heating element for an annealed set of non-volatile memory elements 123 and a second set of non-volatile memory elements 123, to prevent heat from the heating element from reaching the second set of non-volatile memory elements 123. In another embodiment, a heat shield 404, 406 disposed between sets of non-volatile memory elements 123 may include a mechanical shield that reflects, absorbs, or dissipates heat from annealing the first set of non-volatile memory elements 123, to prevent the second set of non-volatile memory elements 123 from overheating. In a certain embodiment, a heat shield 404, 406 may include a passive cooling element that conducts heat away from the second set of non-volatile memory elements 123. In certain embodiments, a passive cooling element may remove heat by thermal conduction, without actively expending energy for cooling by circulating coolant or air, using active refrigeration, or the like. For example, in various embodiments, a heat shield 404, 406 with a passive cooling element may include a heat sink, thermally conductive fins, or the like.

In one embodiment, a heat shield 404, 406 may include an active cooling device configured to transfer heat away from a set of non-volatile memory elements 123. In various embodiments, an active cooling device may refer to a cooling device that is capable of being activated to transfer heat away from a set of non-volatile memory elements 123. An active cooling element or device may expend energy to cool a set of non-volatile memory elements 123. For example, in some embodiments, an active cooling device may circulate air, gaseous coolant, or liquid coolant between a set of non-volatile memory elements 123 and a colder area. In further embodiments, an active cooling device may provide refrigeration using thermoelectric cooling, compression and evaporation of a circulating coolant, or the like. Various types of active cooling will be clear in view of this disclosure.

In certain embodiments, a heat shield 404, 406 may combine passive and active cooling. For example, in one embodiment, a heat shield 404, 406 may include a metal plate or block that dissipates heat from a set of non-volatile memory elements 123, and coolant that is circulated through channels in the metal plate or block if the temperature of the set of non-volatile memory elements 123 exceeds a threshold. In a certain embodiment, a heat shield 404, 406 may include a copper plate, and coolant pipes configured to circulate coolant within the copper plate.

In various embodiments, a heat shield 404, 406 may be attached to the top of a chip package 402 for a non-volatile storage die, or adjacent to a chip package 402 for a non-volatile storage die. With reference to a chip package 402 or a non-volatile memory element 123, directional language such as "top," "adjacent to," or the like refers to an orientation in which a substrate (e.g., a printed circuit board for a non-volatile memory element 123) is below the chip package 402. Directional language is not intended to imply absolute relationships; for example, a heat shield 404, 406 attached to the "top" of a chip package 402 may be moved to be actually underneath a chip package 402 simply by turning the non-volatile memory element 123 over. Nevertheless, the relative relationship between the chip package 402 and the heat shield 404, 406 is unchanged.

In the embodiment depicted in FIG. 4A, the heat shield 404 is attached to the top of the chip packages 402. Attaching a heat shield 404 above a plurality of chip packages 402 may provide good thermal contact between the heat shield 404 and each chip package 402, but may increase the height of the non-volatile memory element 123 (e.g., expansion card) that includes the chip packages.

In certain embodiments, height constraints, such as the spacing between non-volatile memory elements 123 in the enclosure 302 of FIG. 3, may not provide clearance for a heat shield 404 attached to the top of chip packages 402 (e.g., between non-volatile memory elements 123 in expansion card form). Thus, in certain embodiments, a heat shield 406 may be disposed adjacent to, rather than on top of, chip packages 402. For example, in the embodiment depicted in FIG. 4B, the heat shield 406 is attached to a printed circuit board for the non-volatile memory element 123, adjacent to the chip packages 402. In certain embodiments, a heat shield 406 disposed adjacent to a row of chip packages 402 may be smaller than a heat shield 404 attached to the top of chip packages 402, or less effective at cooling more distant chip packages 402 which the heat shield 406 does not directly contact, but may fit within height constraints for a non-volatile memory element 123.

Figure 5A:
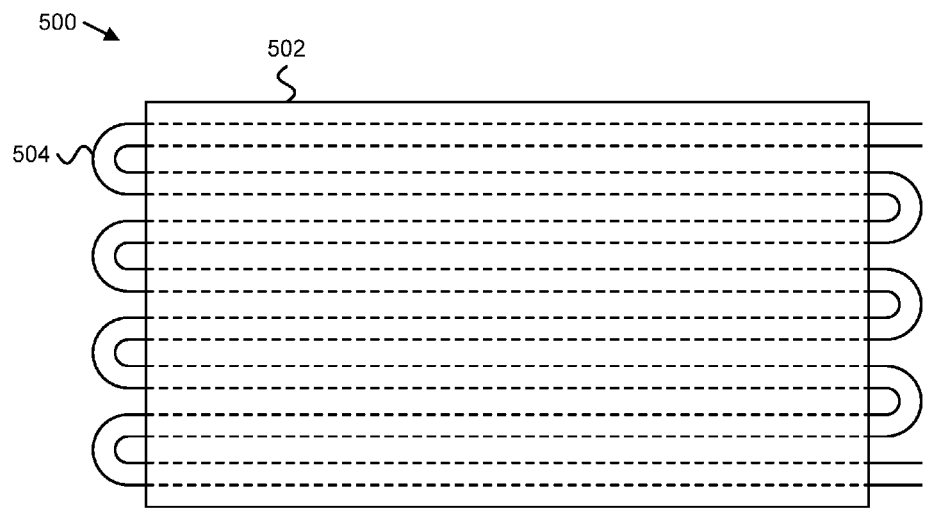
FIG. 5A is a top view illustrating one embodiment of a heat shield.

FIG. 5A depicts one embodiment of a heat shield 500. The heat shield 500 may be substantially similar to the heat shield 404, 406 described above with regard to FIGS. 4A-4B, and may be configured to prevent non-volatile memory elements from overheating while other non-volatile memory elements are annealed. In the depicted embodiment, the heat shield 500 includes a copper plate 502 and one or more coolant pipes 504 for circulating coolant within the copper plate 502.

The copper plate 502, in various embodiments, may be thermally coupled to a non-volatile memory element 123. For example, the copper plate 502 may be disposed on top of or adjacent to chip packages for a non-volatile memory element. In certain embodiments, a copper plate 502 may efficiently transfer heat from a non-volatile memory element to coolant within the coolant pipes 504. Although the heat shield 500 includes a copper plate 502 in the depicted embodiment, a heat shield 500 may include an aluminum plate or another thermally conductive material in another embodiment. The dimensions of the copper plate 502 may be selected based on the size of the non-volatile memory element(s) that the heat shield 500 will be used in conjunction with, based on a clearance between non-volatile memory elements, and/or based on desired thermal properties for the heat shield 500.

The coolant pipes 504, in various embodiments, allow coolant to circulate through or within the copper plate 502. For example, in one embodiment, a pump may circulate coolant through the coolant pipes 504, within the copper plate 502. In one embodiment, a coolant pipe 504 may include one or more channels or tubes drilled or otherwise machined within the copper plate 502, and additional tubing exterior to the copper plate that joins individual channels. In another embodiment, a coolant pipe 504 may include tubing interior to the copper plate 502, to prevent coolant from corroding the copper plate 502.

In one embodiment, a coolant pipe 504, or multiple linked coolant pipes 504, may form a single coolant circuit, with one inlet and one outlet. For example, in the depicted embodiment, coolant pipes 504 circulate coolant back and forth within the copper plate 502 multiple times before the coolant reaches an outlet. In another embodiment, coolant pipes 504 may form independent coolant circuits that each circulate coolant from an inlet to an outlet, so that the heat shield 500 includes multiple inlets and multiple outlets.

In one embodiment, the heat shield 500 may include a single copper plate 502, with coolant pipes 504 added to the copper plate 502. In another embodiment, a heat shield 500 may include a copper plate 502 with open channels machined or otherwise formed in the copper plate (e.g., without external coolant pipe components), and one or more additional plates that cover or link the open channels. Various ways of forming a copper plate 502 with coolant pipes 504 or similar channels for circulating coolant will be clear in view of this disclosure.

Figure 5B:
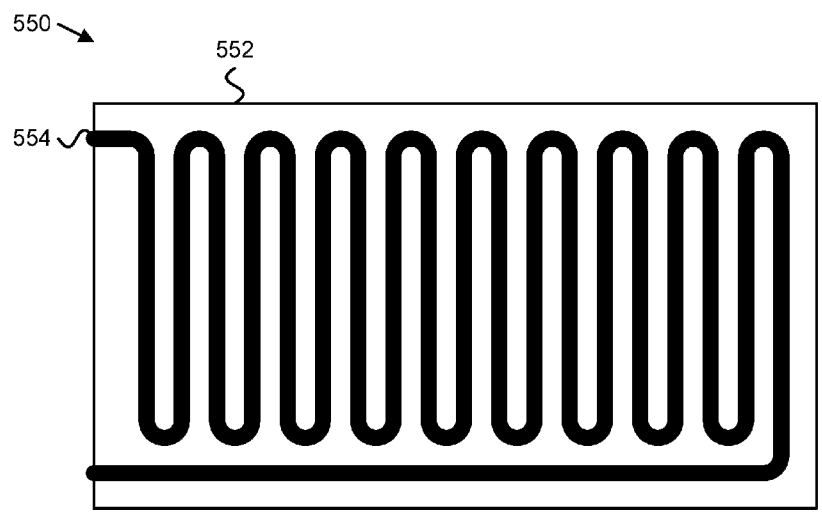
FIG. 5B is a top view illustrating one embodiment of a heating element.

FIG. 5B depicts one embodiment of a heating element 550. In general, in various embodiments, the heating element 550 is configured to heat a set of non-volatile memory elements to anneal the set of non-volatile memory elements. For example, in one embodiment, a resistive heating element 550 may produce heat to anneal a set of non-volatile memory elements.

In the depicted embodiment, the heating element 550 includes a substrate 552 and a line metal heater 554. In one embodiment, the line metal heater 554 is a resistive metal heater, which produces heat in response to an electrical current. Although the heating element 550 includes a line metal heater 554 in the depicted embodiment, a heating element 550 in another embodiment may include a ceramic, polymer, composite or other material that produces heat in response to an electrical current. In various embodiments, a "line" metal heater 554 may refer to a metal heater through which current moves from one end of a "line" to the other, even if the line is curved, coiled, serpentine, or otherwise not actually in the form of a straight line. A line metal heater 554 may include a resistive wire, etched foil, a deposited metal film, or the like.

In another embodiment, a heating element 550 may heat non-volatile memory elements other than by resistive electrical heating. For example, in various embodiments, a heating element may include a heat pump that circulates a heated liquid through a copper plate, similar to the cooling element 500 of FIG. 5A, a thermoelectric heating element, or the like. Many types of electric and other heating elements will be clear in view of this disclosure.

In the depicted embodiment, the line metal heater 554 is bonded or otherwise attached to a substrate 552. The substrate 552 may support and/or protect the metal heater 554. In one embodiment, the substrate 552 may be a printed circuit board. In a certain embodiment, the substrate 552 may be configured to have certain thermal properties. For example, in one embodiment, the substrate 552 may be coupled to a set of non-volatile memory elements to be annealed, and may be configured to transfer heat from the line metal heater 554 to the non-volatile memory elements. In another embodiment, the line metal heater 554 may be between the non-volatile memory elements and the substrate 552, and the substrate may be configured to block heat transfer away from the non-volatile memory elements that are being annealed, reflect heat back to the non-volatile memory elements that are being annealed, or the like.

In certain embodiments, heating elements 550 and heat shields 500 may be combined. For example, in one embodiment, an apparatus for preventing overheating, for annealing non-volatile memory, may include a heating element 550 for heating a first set of non-volatile memory elements, and a heat shield 500 that prevents a second set of non-volatile memory elements from overheating. In a further embodiment, an apparatus may include an additional heating element configured to anneal the second set of non-volatile memory elements, and the additional heating element may be combined with or disposed within the heat shield 500. For example, the copper plate 502 for a heat shield 500 may act as a thermally conductive substrate 552 for a heating element 550, so that the same device acts as a heat shield if coolant is circulated, and a heating element if electrical current is supplied. Similarly, a heat shield for the first set of non-volatile memory elements may be combined with the first heating element 550, so that both a heating element and a heat shield are provided for each set of non-volatile memory elements.

Figure 6A:
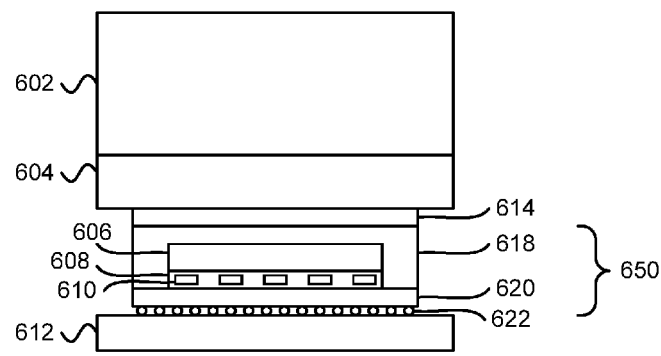
FIG. 6A is a side cross-section view illustrating one embodiment of heating and cooling elements in relation to a chip package.

FIGS. 6A-6D depict various embodiments of heating and cooling elements in relation to a chip package 650, 660, 670, 680. The chip package 650, 660, 670, 680 may be substantially similar to the chip package 402 described above with regard to FIGS. 4A and 4B. In one embodiment, as depicted in FIG. 6A, a chip package 650 may include a die 606, a die attach material 608, a substrate 620, a ball grid array 622, and a mold compound 618. The die 606 may include an array of non-volatile storage cells, and may, in some embodiments, be substantially similar to the die 212 described above with regard to FIG. 2. Although one die 606 is depicted in FIG. 6A, a chip package 650 in another embodiment may include a plurality of dies 606.

The substrate 620 may include a printed circuit board or other material that supports the die 606 and provides electrical connections between the die 606 and the ball grid array 622. The die attach material 608 may include solder, a eutectic mixture, epoxy, or the like, that bonds the die 606 to the substrate 620. The ball grid array 622 may include solder balls for surface-mount attachment of the chip package 650. The mold compound 618 may be a resin or other material that protects the die 606. In various embodiments, chip packages may include various alternative or additional elements, such as ceramic packages, packages with pins for through-hole mounting, or the like. Many types of chip packages 650 for non-volatile memory media will be clear in view of this disclosure.

In the depicted embodiment, the chip package 650 includes one or more resistors 610 disposed within the chip package 650 between the substrate 620 and the non-volatile storage die 606 (e.g., within the die attach material 608). In a certain embodiment, a heating element for annealing a non-volatile memory element or set of non-volatile memory elements that includes the chip package 650 may include the resistors 610. In some embodiments, disposing heating resistors 610 on the substrate 620, immediately under the die 606, may provide close thermal contact between the resistors 610 and the die 606, and may prevent excessive amounts of heat from being transferred to components other than the die.

In the depicted embodiment, the chip package 650 is coupled to a printed circuit board 612. For example, as described with regard to FIGS. 4A-4B, a non-volatile memory element may include a printed circuit board and multiple chip packages 650. In the depicted embodiment a cooling element 604 is coupled to the top of the chip package 650. The cooling element 604 may be substantially similar to the heat shield 404 coupled to the top of chip packages 402 as described above with regard to FIG. 4A. In a certain embodiment, a layer of thermal interface material 614 may be disposed between the cooling element 604 and the chip package 650 to enhance the thermal coupling between the cooling element 604 and the chip package 650. In various embodiments, a thermal interface material 614 may include thermal grease, thermal glue, a thermal pad, or the like, that conducts heat between the cooling element 604 and the chip package 650.

In the depicted embodiment, a cooling fan 602 is disposed above the cooling element 602. In certain embodiments, one or more cooling fans 602 for an array of non-volatile memory elements may decrease or increase airflow to manage temperatures. For example, in one embodiment, a cooling fan 602 may be configured to decrease airflow to a first set of non-volatile memory elements being annealed. Decreasing airflow may avoid heat dissipation away from the set of non-volatile memory elements that are being annealed. In a further embodiment, a cooling fan 602 may be configured to increase airflow to a second set of non-volatile memory elements, which are not being annealed, during annealing of the first set of non-volatile memory elements. Increasing airflow may increase heat transfer away from the second set of non-volatile memory elements to prevent overheating. For example, in one embodiment, heating resistors 610 may be activated to anneal a chip package 650 in one set of non-volatile memory elements, and the cooling fan 602 for that set of non-volatile memory elements may be slowed down or turned off to decrease airflow. In a further embodiment, coolant may be circulated through the cooling element 604 for a chip package 650 in another set of non-volatile memory elements, and a cooling fan 602 for that set of non-volatile memory elements may be sped up or turned on to increase airflow.

Figure 6B:
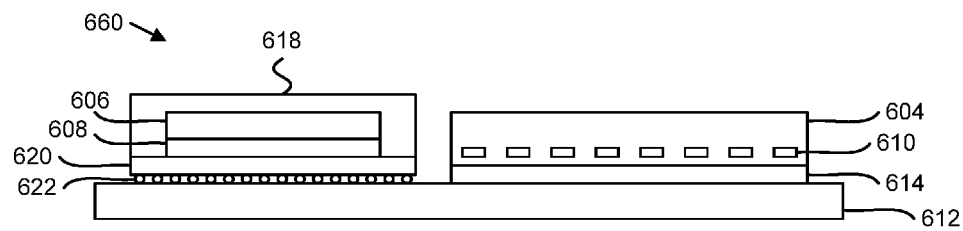
FIG. 6B is a side cross-section view illustrating another embodiment of heating and cooling elements in relation to a chip package.
Figure 6C:
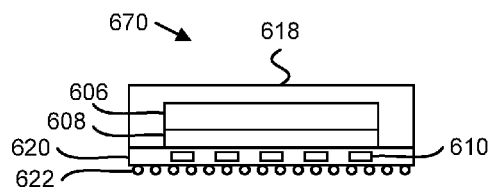
FIG. 6C is a side cross-section view illustrating another embodiment of heating elements in relation to a chip package.
Figure 6D:
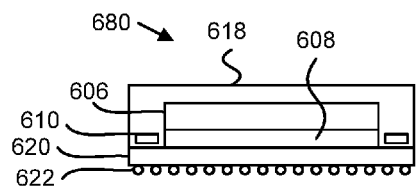
FIG. 6D is a side cross-section view illustrating another embodiment of heating elements in relation to a chip package.

FIGS. 6B, 6C, and 6D depict further embodiments of chip packages 660, 670, and 680 (respectively), which may be substantially similar to the chip package 650 described above with regard to FIG. 6A, including a die 606, a die attach material 608, a substrate 620, a ball grid array 622, and a mold compound 618. Cooling elements 604, thermal interface materials 614, printed circuit boards 612, heating resistors 610, and the like may also be substantially as described above with regard to FIG. 6A, but may differ from FIG. 6A as described below.

In FIG. 6B, the chip package 660 does not include heating resistors 610. Rather, heating resistors 610 are disposed within the cooling element 604. In certain embodiments, disposing heating resistors 610 within a cooling element 604 may provide a combined heating/cooling element that heats when heating resistors 610 are activated and cools either passively, or actively when coolant is circulated. Also, in the depicted embodiment, the cooling element 604 is coupled directly to the printed circuit board 612 (via thermal interface material 614), adjacent to the chip package 660. The cooling element 604 may be substantially similar to the heat shield 406 coupled adjacent to the chip packages 402 as described above with regard to FIG. 4A. Disposing a cooling element 604 on a printed circuit board 612 adjacent to a chip package 660, instead of on top of a chip package, may avoid exceeding height constraints for components on the printed circuit board 612.

FIGS. 6C and 6D do not depict a cooling element. However, a cooling element may be used with the chip packages 670, 680 of FIGS. 6C and 6D, either on top of or adjacent to the chip packages 670, 680, as in FIG. 6A or FIG. 6B. In FIG. 6C heating resistors 610 are embedded within the substrate 620 of the chip package 670, rather than between the substrate 620 and the die 606 as in FIG. 6A. In FIG. 6D, heating resistors 610 are disposed within the chip package 680, to the side of the die 606. In general, in various embodiments, disposing resistors 610 within a chip package 650, 670, 680, whether underneath the die 606, to the side of the die 606, within the die attach material 608, within the substrate 620, or the like, may allow a heating element including the resistors 610 to heat a set of non-volatile memory elements by directly heating chip packages, so that other components, such as further electronics within the annealed set of non-volatile memory elements, or a non-annealed set of non-volatile memory elements, are heated only indirectly. Various further configurations of heating resistors 610 and chip packages will be clear in view of this disclosure.

In a further embodiment, a chip package may be directly heated without dedicated heating resistors, by driving high currents through word lines or bit lines to heat a die 606. In another embodiment, a chip package may be heated using any combination of heating resistors, separate heating elements as depicted in FIG. 5B, high current drivers for word lines and/or bit lines, or the like.

Figure 7:
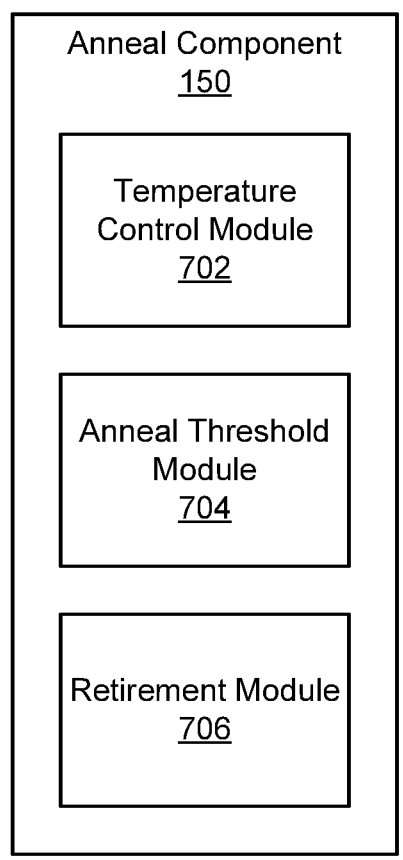
FIG. 7 is a schematic block diagram illustrating one embodiment of an anneal component.

FIG. 7 depicts one embodiment of an anneal component 150. The anneal component 150 may be substantially similar to the anneal component 150 described above with regard to FIGS. 1 and 2, and may include one or more heating elements, heat shields, or cooling elements as described above with regard to FIGS. 4A-6D. In general, as described above, the anneal component 150 heats a first set of non-volatile memory elements to anneal the first set of non-volatile memory elements, and prevents a second set of non-volatile memory elements from overheating during annealing of the first set of non-volatile memory elements. In the depicted embodiment, the anneal component 150 includes a temperature control module 702, an anneal threshold module 704, and a retirement module 706. In another embodiment, however, the anneal component 150 may include a temperature control module 702, without an anneal threshold module 704 and/or a retirement module 706.

In certain embodiments, a controller such as the non-volatile memory media controller 126, die controller 220, or the like may include the temperature control module 702, the anneal threshold module 704, the retirement module 706, and/or additional modules described below with regard to FIG. 8. In one embodiment, the controller may include a hardware controller, such as non-volatile memory media controller 126, for a storage device that includes one or more non-volatile memory elements 123. In another embodiment, the controller may include a device driver, for a storage-device that includes one or more non-volatile memory elements 123. In a further embodiment, the device driver may include logic hardware and/or executable code stored on one or more computer readable storage media.

In general, in various embodiments, the temperature control module 702 manages or controls temperatures of non-volatile memory elements, or sets of non-volatile memory elements, to anneal non-volatile memory elements while preventing other non-volatile memory elements from overheating. In a certain embodiment, the temperature control module 702 may include or be in communication with one or more heating elements, heat shields, and/or cooling elements as described above. For example, in one embodiment, a controller including a temperature control module 702 may activate a heating element and a cooling element to anneal a first set of non-volatile memory elements and to cool a second set of non-volatile memory elements.

In one embodiment, the temperature control module 702 may activate heating and cooling elements simultaneously for different sets of non-volatile memory elements. In another embodiment, the temperature control module may activate the heating element for a first set of non-volatile memory elements prior to activating the cooling element for a second set of non-volatile memory elements, or may activate the cooling element for the second set of non-volatile memory elements prior to activating the heating element for the first set of non-volatile memory elements. In various embodiments, the temperature control module 702 may activate heating and cooling elements in various orders, patterns, sequences, and the like. For example, an activation time or intensity may vary between heating elements, between cooling elements, or between heating and cooling elements. As a further example, a heating time for a heating element may be long, with a low intensity to supply heat continuously during annealing of a first set of non-volatile memory elements, and a cooling element for a second set of non-volatile memory elements may be activated intermittently, with full intensity, to prevent overheating. In one embodiment, activating the heating element and the cooling element may include activating the heating element for a first time and a first intensity, and activating the cooling element for a second time and a second intensity different from the first time and/or the first intensity. Other patterns of time and intensity for annealing and cooling non-volatile memory elements will be clear in view of this disclosure.

In a certain embodiment, a temperature control module 702 may include or be in communication with hardware for activating heating elements and/or cooling elements, such as high-power transistors for switching current to heating elements, charge pumps for driving high currents through word lines or bit lines, coolant pumps for circulating coolant through a heat shield or cooling element, fan controllers for cooling fans, or the like. In a further embodiment, a temperature control module 702 may include or be in communication with hardware for measuring temperature, such as one or more thermocouples, thermistors, or the like, and may be configured to control or manage heating and/or cooling based on a measured temperature.

In a further embodiment, the temperature control module 702 may control or manage an anneal temperature and an anneal duration. In one embodiment, an annealing temperature or duration may be selected based on a desired improvement to the annealed set of non-volatile memory elements 123. In a certain embodiment, an annealing temperature or duration may be selected based on a heat tolerance of other components, such as a temperature rating of electronic components in proximity to the annealed set of non-volatile memory elements 123, a solder melting point, rates of data errors at various temperatures for other non-volatile memory elements 123, or the like. In one embodiment, an anneal temperature may be selected from a range, from approximately 150 degrees Celsius to 250 degrees Celsius. In another embodiment, an anneal temperature may be approximately 170 to 175 degrees Celsius. Various ways of selecting and controlling anneal temperatures and durations will be clear in view of this disclosure.

In one embodiment, the temperature control module 702 may determine which non-volatile memory elements to anneal, and/or when to anneal a set of non-volatile memory elements. For example, in one embodiment, the temperature control module 702 may schedule annealing for a set of non-volatile memory elements based on one or more events that trigger annealing. In certain embodiments, the temperature control module 702 may schedule annealing based on any event, measurement, indication, or the like, that corresponds, directly or indirectly, to damage that may be reduced or errors that may be improved by annealing. For example, in various embodiments, the temperature control module 702 may schedule annealing based on a chronological age, a time in operation, a program/erase cycle count, a reliability metric, an error rate, or the like for a non-volatile memory element. In further embodiments, events that trigger annealing may include one or more metrics such as an age, time in operation, program/erase cycle count, reliability metric, error rate, or the like satisfying a threshold for annealing a non-volatile memory element. In response to a metric satisfying a threshold or another event that triggers annealing, the temperature control module 702 may schedule annealing, communicate with a controller to prepare a non-volatile memory element for annealing, begin annealing, or the like.

In certain embodiments, the anneal threshold module 704 may determine whether an anneal threshold has been exceeded for a non-volatile memory element, and the retirement module 706 may retire the non-volatile memory element in response to determining that the anneal threshold has been exceeded. In certain embodiments, annealing a non-volatile memory element may return a non-volatile medium to approximately its original state, so that the longevity or endurance of a non-volatile memory element may be extended effectively indefinitely by repeated annealing. In another embodiment, however, repeated annealing of a non-volatile memory element may provide diminishing returns. For example, in one embodiment, annealing a non-volatile memory element may heal or reverse damage caused by repeated writing or erasing, but a rate of damage may increase with the age of the non-volatile memory element, a number of program/erase cycles, or the like, so that events that trigger annealing occur increasingly often. In another embodiment, annealing a non-volatile memory element may heal or reverse some damage, but irreversible damage may also accumulate over time, which is not reversed even by repeated annealing.

Thus, in certain embodiments, a non-volatile memory element may be retired (either from use or from further annealing) based on expected diminishing returns from repeated annealing. For example, in one embodiment, a controller that includes an anneal threshold module 704 and a retirement module 706 may retire at least one non-volatile memory element in response to determining that an anneal threshold has been exceeded.

The anneal threshold module 704, in one embodiment, may determine whether an anneal threshold has been exceeded for a non-volatile memory element. In a certain embodiment, an anneal threshold may include an anneal count and/or an anneal frequency.

In various embodiments, an anneal count may refer to a maximum number of anneals for a non-volatile memory element. For example, in a certain embodiment, an anneal count for a non-volatile memory element may include a number of anneals allocated for a lifetime of the non-volatile memory element based on expected reliability of the non-volatile memory element. In one embodiment, an anneal count may be specified by a manufacturer for the non-volatile memory element. In another embodiment, an anneal count may be specified by a user or administrator for a system including the non-volatile memory element. In a certain embodiment, the anneal count may be based on expected reliability for the non-volatile memory element. For example, in one embodiment, if a non-volatile memory element is expected to have a high reliability, it may not need to be annealed very often, and more than a small number of anneals taking place may indicate an unexpected problem. Thus, in a further embodiment, a low anneal count may be specified for a non-volatile memory element that is expected to have a high reliability. Conversely, a higher anneal count may be specified for a non-volatile memory element that is expected to have a lower reliability or to need annealing often. In one embodiment, a total maximum anneal count may be established for a system including multiple non-volatile memory elements, and allocated among the non-volatile memory elements, so that each non-volatile memory element has a separate maximum anneal count. In certain embodiments, an anneal threshold module 704 may determine that an anneal threshold is satisfied or exceeded for a non-volatile memory element if the number of actual anneals for the non-volatile memory element equals or exceeds the anneal count.

In some embodiments, an anneal threshold may include an anneal frequency. In various embodiments, an anneal frequency may refer to a maximum (or minimum) for any measurement or indication that corresponds to how often anneals occur, or a time between anneals. For example, in various embodiments, an anneal frequency for a non-volatile memory element may include a number of anneals for the non-volatile memory element within a certain timeframe, a number of number of program/erase cycles between anneals for the non-volatile memory element, a number of program/erase cycles between events that trigger annealing for the non-volatile memory element, an actual elapsed time between anneals or events that trigger annealing, or the like. In some embodiments, if an anneal, or an event that triggers annealing, occurs too often for a non-volatile memory element, then the non-volatile memory element may be degrading faster than expected. Thus, in certain embodiments, an anneal threshold module 704 may determine that an anneal threshold is satisfied or exceeded for a non-volatile memory element if an actual measurement or indication that corresponds to how often anneals occur, or a time between anneals violates an established limit for the anneal frequency.

In one embodiment, if the anneal threshold module 704 bases the anneal frequency on a measurement that increases if anneals happen more often, such as a number of anneals in a certain timeframe, the anneal frequency may be exceeded if the actual measurement is above the established anneal frequency. In another embodiment, if the anneal threshold module 704 bases the anneal frequency on a measurement that decreases if anneals happen more often, such as a number of program/erase cycles between anneals, the anneal frequency may be violated if the actual measurement is below the established anneal frequency. For the purpose of generality in description, however, the anneal frequency may still be described as "exceeded" if it is violated by an actual measurement below an established minimum.

In one embodiment, an anneal threshold used by the anneal threshold module 704 may include both an anneal count and an anneal frequency, and the anneal threshold module 704 may determine that the anneal threshold is exceeded based on the earlier of the anneal count being exceeded and the anneal frequency being exceeded. In some embodiments, either the anneal count being exceeded or the anneal frequency being exceeded may indicate a problem such as an unexpected rate of damage for a non-volatile memory element. Thus, in further embodiments, the anneal threshold module 704 may determine that the anneal threshold is exceeded based on either the anneal count being exceeded or the anneal frequency being exceeded, whichever comes first.

The retirement module 706 may be configured to retire a non-volatile memory element in response to the anneal threshold module 704 determining that the anneal threshold for the non-volatile memory element has been exceeded. In general, in various embodiments "retiring" a non-volatile memory element may refer to making a change that reduces or eventually ends annealing or use of the non-volatile memory element. For example, in one embodiment, retiring a non-volatile memory element may include retiring the non-volatile memory element from further annealing by indicating that no further anneals are to be performed for the non-volatile memory element, cancelling scheduled annealing for the non-volatile memory element, stopping tracking of events that trigger annealing for the non-volatile memory element, or the like. In another embodiment, retiring a non-volatile memory element may include retiring the non-volatile memory element from further use, by moving data off the non-volatile memory element and ending use, by marking the non-volatile element as read-only, so that no further data is written to the non-volatile memory element, and so that grooming, garbage collection, or wear-leveling eventually moves data off of the non-volatile memory element, or the like. In certain embodiments, retiring a non-volatile element from further annealing may eventually result in retiring the non-volatile element from further use, if damage accumulates that will not be reversed or healed by further annealing. Many further ways for a retirement module 706 to retire a non-volatile element will be clear in view of this disclosure.

Figure 8:
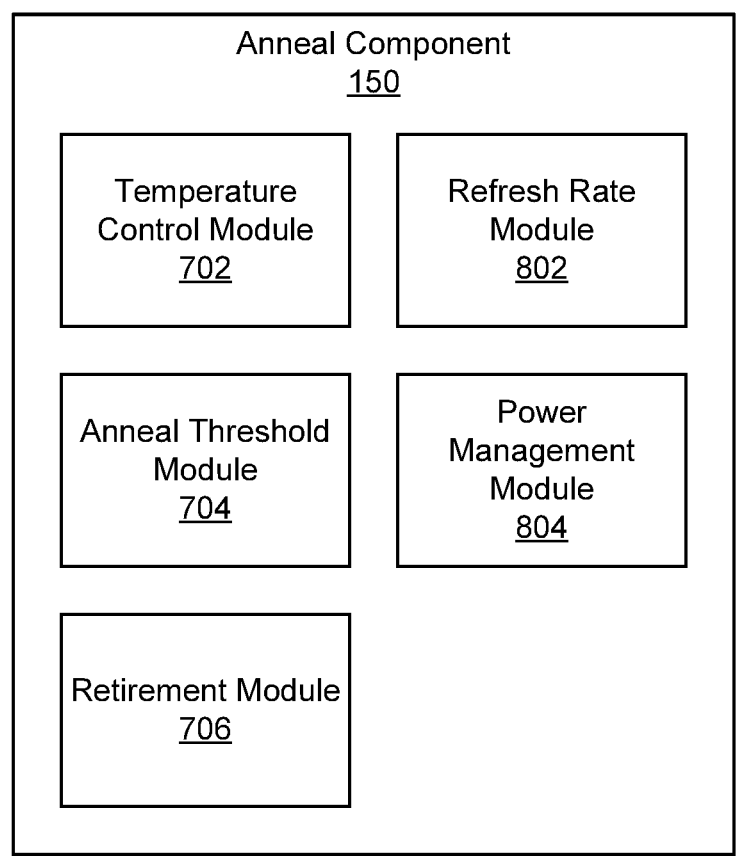
FIG. 8 is a schematic block diagram illustrating a further embodiment of an anneal component.

FIG. 8 depicts a further embodiment of an anneal component 150. The anneal component 150, in certain embodiments, may be substantially similar to the anneal component 150 described above with regard to FIGS. 1, 2, and/or 7. In the depicted embodiment, the anneal component 150 includes a temperature control module 702, an anneal threshold module 704, and a retirement module 706, which may be configured substantially as described above with regard to FIG. 7. The anneal component 150, in the depicted embodiment, includes a refresh rate module 802 and a power management module 804.

The refresh rate module 802, in one embodiment, is configured to increase a refresh rate for one set of non-volatile memory elements during annealing of another set of non-volatile memory elements. For example, in one embodiment, the temperature control module 702 may anneal a first set of non-volatile memory elements and cool a second set of non-volatile memory elements, and a controller may use the refresh rate module 802 to increase a refresh rate for the second set of non-volatile memory elements during annealing of the first set of non-volatile memory elements.

In various embodiments, the refresh rate module 802 may cooperate with a groomer, garbage collector, wear leveler, or the like, to refresh data by reading and rewriting the data. For example, in one embodiment, the refresh rate module 802 may refresh data within a set of non-volatile memory elements by reading the data from a first data location, marking data in the original data location as invalid, and re-writing the data to another data location (e.g., another page, another block, another non-volatile memory element, another set of non-volatile memory elements) or the like. In various embodiments, a refresh rate for a set of non-volatile memory elements may refer to a rate at which data is refreshed.

In certain embodiments, data errors may naturally occur at a certain rate during normal operation (apart from annealing), and data may be periodically refreshed to correct errors before an uncorrectable number of errors accumulates, to accumulate pages of valid data from blocks where other data has been marked as invalid (so that the blocks with invalid data can be erased), to level wear by reusing infrequently used blocks, or the like. In certain embodiments, a rate of data errors for a set of non-volatile memory elements may increase due to heat from annealing another set of non-volatile memory elements, even if the data errors are mitigated by shielding or cooling the non-annealed non-volatile memory elements. Thus, in further embodiments, the refresh rate module 802 may increase a refresh rate for one set of non-volatile memory elements during annealing of another set of non-volatile memory elements, to increase the likelihood that data will be refreshed before an uncorrectable number of errors accumulates at the increased error rate.

The power management module 804, in one embodiment, is configured to throttle power for one set of non-volatile memory elements during annealing of another set of non-volatile memory elements. For example, in one embodiment, the temperature control module 702 may anneal a first set of non-volatile memory elements and cool a second set of non-volatile memory elements, and a controller may use the power management module 804 to throttle power for the second set of non-volatile memory elements during annealing of the first set of non-volatile memory elements.

In certain embodiments, a system that includes multiple non-volatile memory elements may experience increased power usage during annealing of a set of non-volatile memory elements, due to the power involved in heating the annealed non-volatile memory elements, and in cooling other non-volatile memory elements. In further embodiments, however, available power for such a system may be limited. For example, a power supply for a system may have a limited capacity. Therefore, in certain embodiments, a power management module 804 may comply with power limitations by reducing power to non-volatile memory elements when power is being used for heating and/or cooling during an anneal.

In various embodiments, throttling power may refer to controlling, managing, or reducing power usage in any way. For example, in one embodiment, a power management module 804 may throttle power by reducing a clock speed or data rate for a non-volatile memory element. In another embodiment, a power management module 804 may throttle power by allowing a non-volatile element to operate normally so long as a power threshold is satisfied, but by queuing or otherwise delaying data operations for a non-volatile element if the power threshold is violated or exceeded. Many further ways of throttling power for non-volatile memory elements will be clear in view of this disclosure.

Figure 9:
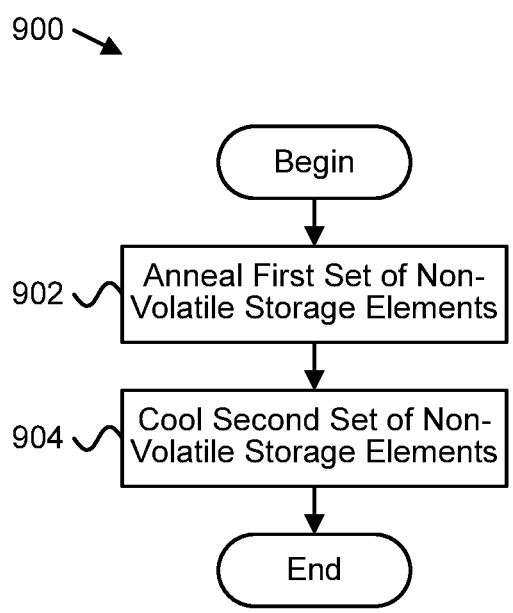
FIG. 9 is a schematic flow chart diagram illustrating one embodiment of a method for preventing overheating, for annealing non-volatile memory.

FIG. 9 is a schematic flow chart diagram illustrating one embodiment of a method 900 for preventing overheating, for annealing non-volatile memory. The method 900 begins, and a heating element anneals 902 a first set of non-volatile storage elements by heating the first set of non-volatile storage elements. A heat shield or cooling element cools 904 a second set of non-volatile storage elements to reduce a rate of data errors caused by heat from annealing the first set of non-volatile storage elements, and the method 900 ends.

Figure 10:
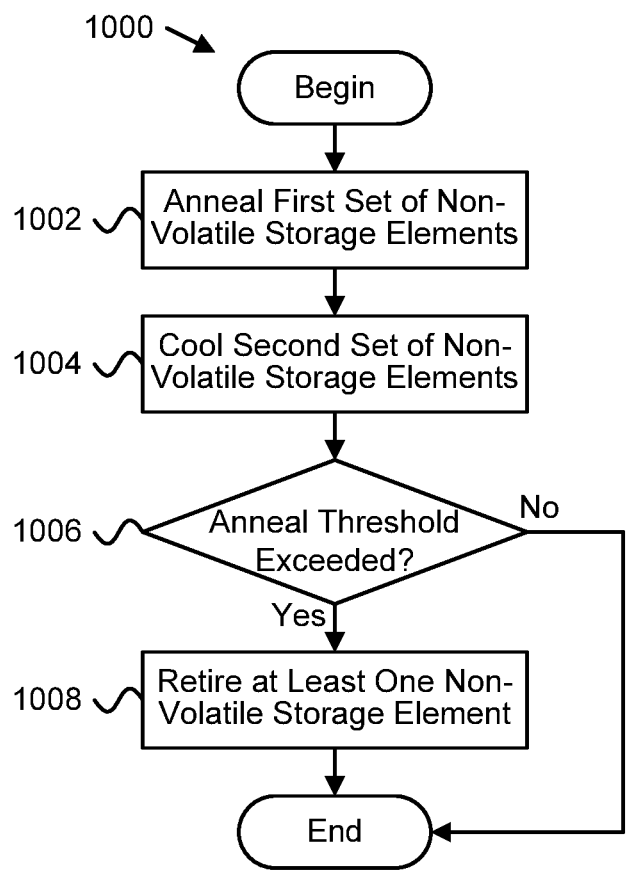
FIG. 10 is a schematic flow chart diagram illustrating a further embodiment of a method for preventing overheating, for annealing non-volatile memory.

FIG. 10 is a schematic flow chart diagram illustrating a further embodiment of a method 1000 for preventing overheating, for annealing non-volatile memory. The method 1000 begins, and a heating element anneals 1002 a first set of non-volatile storage elements by heating the first set of non-volatile storage elements. A heat shield or cooling element cools 1004 a second set of non-volatile storage elements to reduce a rate of data errors caused by heat from annealing the first set of non-volatile storage elements. An anneal threshold module 704 determines 1006 whether an anneal threshold has been exceeded. If the anneal threshold has not been exceeded, the method 1000 ends. If the anneal threshold has been exceeded, a retirement module 706 retires 1008 at least one non-volatile storage element, and the method 1000 ends.

A means for heating a set of non-volatile storage elements, to anneal the first set of non-volatile storage elements, in various embodiments, may include a heating element, a line metal heater, a resistive heating element, a word line, a bit line, a resistor disposed within a chip package, a resistor in thermal communication with a chip package, a voltage source, a charge pump, a thermocouple, a thermistor, a feedback mechanism, a processor, a die controller, a die state machine, a non-volatile memory media controller, a device driver, other logic hardware, and/or other executable code stored on a computer readable storage medium. Other embodiments may include similar or equivalent means for heating a set of non-volatile storage elements.

A means for preventing a set of non-volatile storage elements from overheating, or for cooling a set of non-volatile storage elements, in various embodiments, may include a heat shield, a cooling element, insulating material, a passive cooling element, an active cooling element, a copper plate, coolant pipes for circulating coolant, cooling fans, a coolant pump, a thermoelectric cooler, a thermocouple, a thermistor, a feedback mechanism, a processor, a die controller, a die state machine, a non-volatile memory media controller, a device driver, other logic hardware, and/or other executable code stored on a computer readable storage medium. Other embodiments may include similar or equivalent means for preventing a set of non-volatile storage elements from overheating.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
an array of non-volatile storage elements;
a heating element configured to heat a first set of the non-volatile storage elements to anneal the first set of non-volatile storage elements; and
a heat shield configured to mitigate heating for a second set of the non-volatile storage elements during annealing of the first set of non-volatile storage elements, to mitigate data errors for data stored on the second set of non-volatile storage elements, wherein the heat shield comprises an active cooling device configured to be in an activated state during annealing of the first set of non-volatile storage elements to transfer heat away from the second set of non-volatile storage elements.

2. The apparatus of claim 1, wherein the heat shield comprises one or more of insulating material disposed between the heating element and the second set of non-volatile storage elements, and a passive cooling element that conducts heat away from the second set of non-volatile storage elements.

3. The apparatus of claim 1, wherein the heat shield comprises a copper plate, and one or more coolant pipes configured to circulate coolant within the copper plate.

4. The apparatus of claim 1, further comprising cooling fans for the array of non-volatile storage elements, wherein the cooling fans are configured to decrease airflow to the first set of non-volatile storage elements and increase airflow to the second set of non-volatile storage elements during annealing.

5. The apparatus of claim 1, further comprising an additional heating element configured to anneal the second set of non-volatile storage elements, the additional heating element disposed within the heat shield.

6. The apparatus of claim 1, wherein the heating element comprises one or more of:

a resistor disposed within a chip package to the side of a non-volatile storage die, a resistor disposed within the chip package between a substrate and the non-volatile storage die, a resistor embedded within the chip package substrate, and a line metal heater.

7. The apparatus of claim 1, wherein the heat shield is attached to one or more of:

the top of a chip package for a non-volatile storage die, and a printed circuit board adjacent to a chip package for a non-volatile storage die.

8. The apparatus of claim 1, further comprising a controller configured to retire at least one of the non-volatile storage elements in response to determining that an anneal threshold has been exceeded.

9. An apparatus comprising:

a resistive heating element that produces heat to anneal a first set of non-volatile memory elements;

a cooling element that cools a second set of non-volatile memory elements, in proximity to the first set of non-volatile memory elements, to prevent the second set of non-volatile memory elements from overheating during annealing of the first set of non-volatile memory elements; and a controller configured to activate the heating element and the cooling element to anneal the first set of non-volatile memory elements and to cool the second set of non-volatile memory elements, determine whether an anneal threshold has been exceeded for a non-volatile memory element, the anneal threshold comprising one or more of an anneal count and an anneal frequency, and retire the non-volatile memory element in response to determining that the anneal threshold has been exceeded for the non-volatile memory element.

10. The apparatus of claim 9, wherein the anneal threshold comprises the anneal count and the anneal frequency, and the anneal threshold is exceeded based on the earlier of the anneal count being exceeded and the anneal frequency being exceeded.

11. The apparatus of claim 9, wherein the anneal count comprises a number of anneals allocated for a lifetime of the non-volatile memory element based on expected reliability of the non-volatile memory element.

12. The apparatus of claim 9, wherein the anneal frequency comprises one or more of a number of program/erase cycles between anneals for the non-volatile memory element and a number of program/erase cycles between events that trigger annealing for the non-volatile memory element.

13. The apparatus of claim 9, wherein retiring the non-volatile memory element comprises one or more of retiring the non-volatile memory element from further annealing and retiring the non-volatile memory element from further use.

14. The apparatus of claim 9, wherein the controller is further configured to increase a refresh rate for the second set of non-volatile memory elements during annealing of the first set of non-volatile memory elements.

15. The apparatus of claim 9, wherein activating the heating element and the cooling element comprises activating the heating element for a first duration and a first intensity, and activating the cooling element for a second duration and a second intensity different from one or more of the first duration and the first intensity, wherein at least a portion of the second duration occurs during the first duration.

16. A method comprising:

annealing a first set of non-volatile storage elements by heating the first set of non-volatile storage elements; and using a heat shield to mitigate heating for a second set of non-volatile storage elements to reduce a rate of data errors caused by heat from annealing the first set of non-volatile storage elements, wherein the heat shield comprises a heating element disposed within the heat shield for annealing the second set of non-volatile storage elements.

17. The method of claim 16, further comprising retiring at least one of the non-volatile storage elements in response to determining that an anneal threshold has been exceeded.

18. The method of claim 16, further comprising:

providing an airflow to the first set of non-volatile storage elements and an airflow to the second set of non-volatile storage elements; and decreasing the airflow to the first set of non-volatile storage elements and increasing the airflow to the second set of non-volatile storage elements during annealing.

\* \* \* \* \*